United States Patent [19]
Fisher et al.

[11] Patent Number: 5,590,712
[45] Date of Patent: Jan. 7, 1997

[54] HEAT SINK

[75] Inventors: Francis E. Fisher, Shaw; Robin D. Johnson, Bath; David G. Gove; Michael D. Wade, both of Plympton, all of United Kingdom

[73] Assignee: Redpoint Thermalloy, Ltd., Swindon, United Kingdom

[21] Appl. No.: 439,875

[22] Filed: May 12, 1995

Related U.S. Application Data

[62] Division of Ser. No. 249,393, May 26, 1994.

[30] Foreign Application Priority Data

May 27, 1993 [GB] United Kingdom ............... 9310993

[51] Int. Cl.⁶ ............................................. B23P 13/04
[52] U.S. Cl. ............................................. 165/185; 29/558
[58] Field of Search ............................. 29/558; 165/185, 165/80.3

[56] References Cited

U.S. PATENT DOCUMENTS

| | | | |
|---|---|---|---|
| 3,135,321 | 6/1964 | Butt et al. | 165/154 |
| 3,180,404 | 4/1965 | Nelson et al. | 165/47 |
| 3,242,984 | 3/1966 | Delpeyroux et al. | 165/185 |
| 3,313,339 | 4/1967 | Coe | 165/80 |
| 3,695,081 | 10/1972 | Gartner | 72/254 |
| 3,730,477 | 1/1973 | Wavrunek | 248/243 |
| 4,078,288 | 3/1978 | Abramson | 29/155 R |
| 4,588,028 | 5/1986 | Marshall et al. | 165/185 |
| 4,701,828 | 10/1987 | Weiner | 361/383 |
| 4,746,479 | 3/1988 | Hanaki et al. | 29/890.03 |
| 4,879,981 | 11/1989 | Hinshaw | 29/390.03 |
| 4,884,331 | 5/1994 | Hinshaw | 29/890.03 |
| 5,383,517 | 1/1995 | Dierbeck | 29/890.03 |

*Primary Examiner*—Larry I. Schwartz
*Assistant Examiner*—Marc W. Butler
*Attorney, Agent, or Firm*—Woodcock Washburn Kurtz Mackiewicz & Norris

[57] ABSTRACT

A process for forming a profiled element from a generally longitudinally extending extruded sheet-form member having a plurality of transversely spaced longitudinally extended ribs upstanding therefrom is provided. The process includes the step of removing longitudinally spaced apart portions from some of the ribs by means of a transversely acting punching means.

3 Claims, 6 Drawing Sheets

5,590,712

HEAT SINK

This is a division of application Ser. No. 249,393, filed May 26, 1994.

FIELD OF THE INVENTION

The present invention relates to a process and an apparatus for forming a profiled element which is intended particularly, but not exclusively, for use as a heat dissipating element such as a semi-conductor heat-sink.

BACKGROUND OF THE INVENTION

Heat dissipating elements such as semi-conductor heat-sinks can be of various profiled forms but often comprise a predetermined length cut from a profiled extruded metal member. The profiles of the extruded members used for forming such elements are dictated by the profiles of the dies through which the members are extruded and the profile of an element formed from an extruded member varies across only its width transverse to its direction of extrusion.

U.S. Pat. No. 4,884,331 refers to a process for forming a semi-conductor heat-sink by cross-cut gang sawing in a transverse direction a longitudinally extending profiled extruded metal member. The extruded member comprises a longitudinally extending sheet-form member having a plurality of longitudinally extending transversely spaced ribs upstanding therefrom. By cross-cut sawing the ribs depthwise in a transverse direction at locations along their length and then parting off a predetermined length from a processed portion of the extruded member, a semi-conductor heat-sink comprising a base member having a plurality of transversely spaced rows of longitudinally extending rib portions is formed. The arrangement of the rib portions enhances the heat dissipating efficiency of the heat-sink so formed.

A disadvantage of this process for forming a semi-conductor heat-sink is that it is relatively expensive and slow. The cross-cutting of the ribs creates sharp burrs on the sawn edges which must be removed before the heat-sink can be utilized. The additional step of removing the burrs adds to the expense of the manufacturing process.

Because the rib portions of the heat-sink are formed by cross-cut gang sawing the ribs of an extruded member, the rib portions of adjacent rows are transversely aligned which may limit the heat dissipating efficiency of the heat-sink.

It is an object of the present invention to obviate and mitigate the aforesaid disadvantages.

SUMMARY OF THE INVENTION

According to the invention there is provided a heat dissipating element comprising a sheet-form longitudinally extending base member having a plurality of transversely spaced rows of longitudinally extending and spaced apart rib portions upstanding therefrom.

The rib portions may taper progressively, or incrementally, in a depthwise direction towards the sheet-form member.

The rib portions of adjacent rows may be arranged so as not to be generally in transverse alignment.

The foregoing and further features of the present invention will be more readily understood from the following description with reference to the accompanying drawings.

SHORT DESCRIPTION OF THE DRAWINGS

DESCRIPTION OF THE PREFERRED EMBODIMENT

Figure 1:
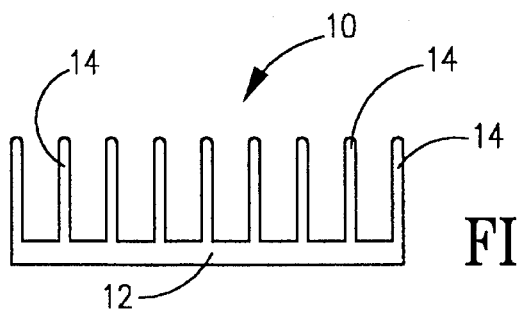
FIG. 1 is an end-on view of an extruded member.

Referring to the drawings, FIG. 1 shows an end-on view of an extruded member 10 comprising a longitudinally extending sheet-form member 12 (more easily seen in FIG. 2) having a plurality of transversely spaced longitudinally extending ribs 14 depending upwardly from said member substantially at right angles to the plane thereof.

Figure 2:
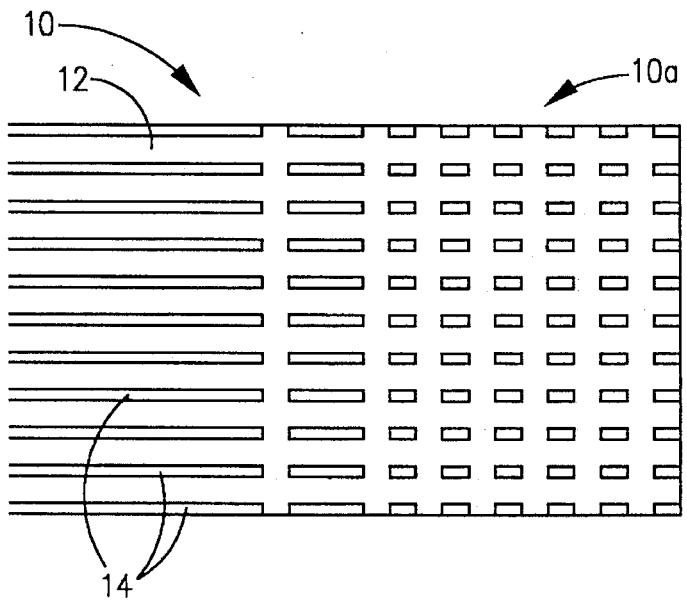
FIG. 2 is a plan view of the extruded member of FIG. 1 with a leading end portion thereof having been processed in accordance with the process of the invention.

The process of the invention can, in principle, be better understood from FIG. 2 which shows, in plan, the extruded member 10 of FIG. 1, which is of indeterminate length. A leading end portion 10a of the extruded member has already been partly processed in readiness for parting-off from the member 10 to form a profiled element 16 (see FIGS. 3 and 4).

The process of the invention generally comprises the step of removing longitudinally extending portions 18 (some of which are shown in broken outline in FIGS. 3 and 4) from the upstanding ribs 14 by means of a transversely acting punching means. Removal of such portions 18 from said ribs 14 results in the formation of transversely spaced rows 20 (coinciding with the ribs) of rib portions 22.

While transverse punching of the ribs 14 to remove longitudinally extending portions 18 could be a step-wise process along the length of each rib 14 of the extruded member 10, it is intended that a punching means capable of sequentially engaging a number of adjacent ribs 14 at a number of locations along extended portions of their lengths in order to transversely punch a number of portions from each of said adjacent ribs in a single punching operation is employed. The punching means could be processor controlled.

The size of a profiled element 16 formed by this process is determined by the width of the extruded member being processed and the length chosen for parting-off a portion of said extruded member.

Experience has shown that transversely punching portions 18 from the ribs 14 does not lead to excessive burring of edges of the rib portions 22 (unlike cross-cut sawing) and any burring which does occur is at an acceptable level and does not require further processing to remove it.

Figure 5:
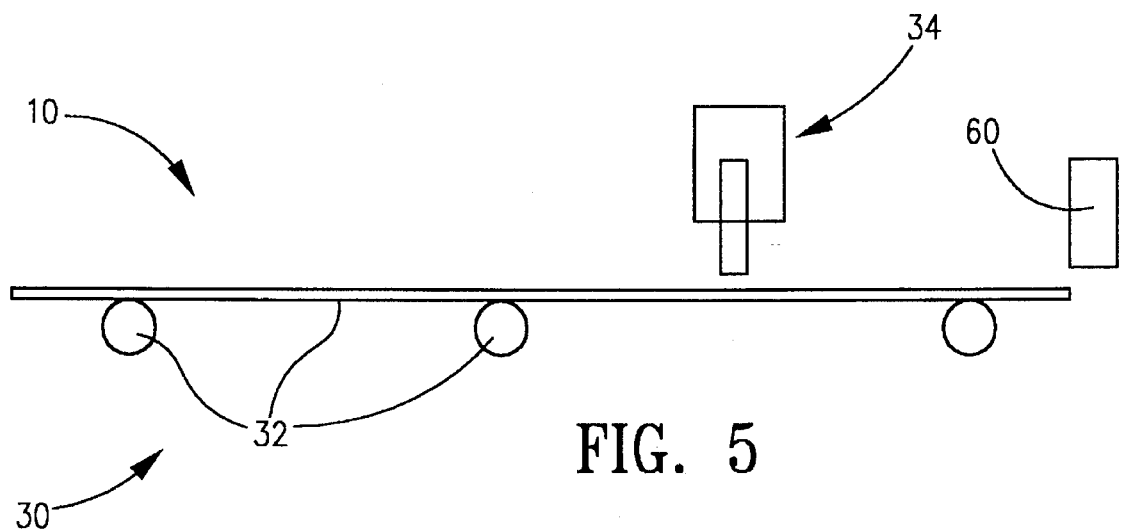
FIG. 5 is a schematic block diagram of an apparatus according to the invention.

FIG. 5 shows a schematic block diagram of an apparatus 30 for use in the process of the invention to form profiled elements. The apparatus comprises means 32 for conveying an extruded member 10 towards a punching means 34. Movement of the extruded member 10 is controlled in a step-wise fashion to provide intervals during which the punching means 34 engages respective portions of the extruded member.

The punching means 34 comprises at least one punch head (punching tool) and a die means which, in use, engage the extruded member 10 such that die members 36 (FIG. 6) of the die means locate adjacent respective side surfaces of ribs 14 and the punch head locates to an opposing side of said ribs. The punching means also includes a means (not shown) for imparting driving force to said punch head to cause said punch head, in use, to move transversely past said die members 36 resulting in the sequential removal from each of the ribs 14 of a longitudinally extending portion 18 thereof.

Figure 6:
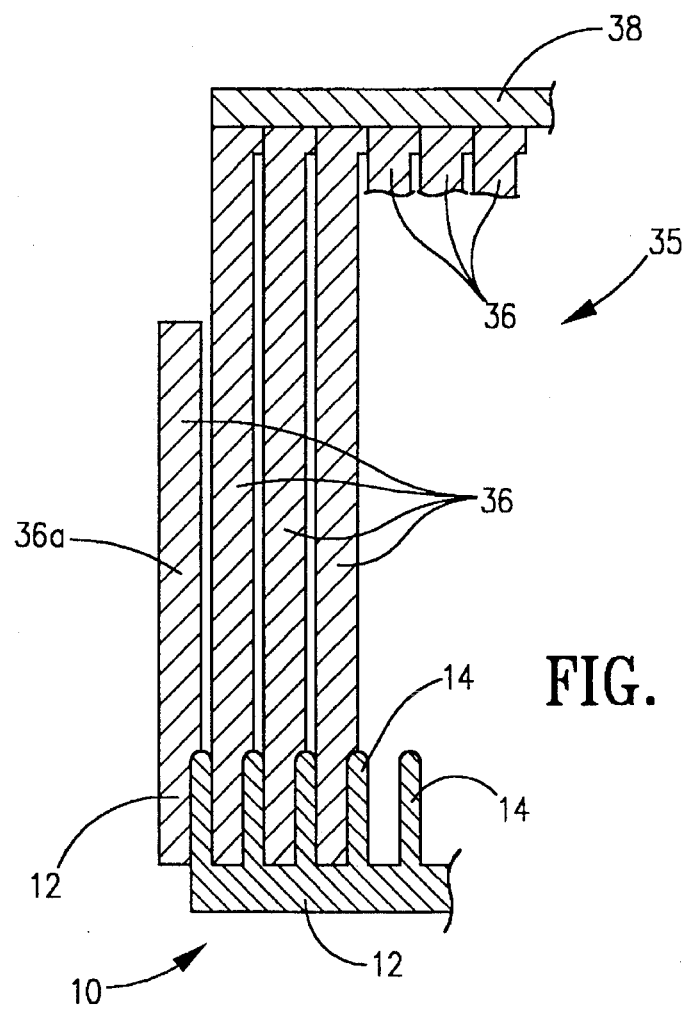
FIG. 6 is an enlarged sectional end view of part of the extruded member engaged by a die means forming part of the apparatus of the invention.

FIG. 6 shows an enlarged sectional view of a part of the die means 35 forming a part of the apparatus. The die means 35 is shown in engagement with an extruded member 10. The die means comprises a fixed die member 36a against which, in use, the extruded member 10 slides when being conveyed toward the punching means 34. The fixed die member 36a is located on a side of the apparatus 30 opposite to that of the punching means 34. The die means 35 also includes a number of further die members 36 whose free ends, in use, locate in gaps between ribs 14 of the extruded member 10 and which each contact a side surface of a respective rib. However, the further die members 36 are pivotally mounted to support member 38 to allow some variance in the transverse positions of their free ends to allow for deviations in the ribs along their lengths.

Figure 6A:
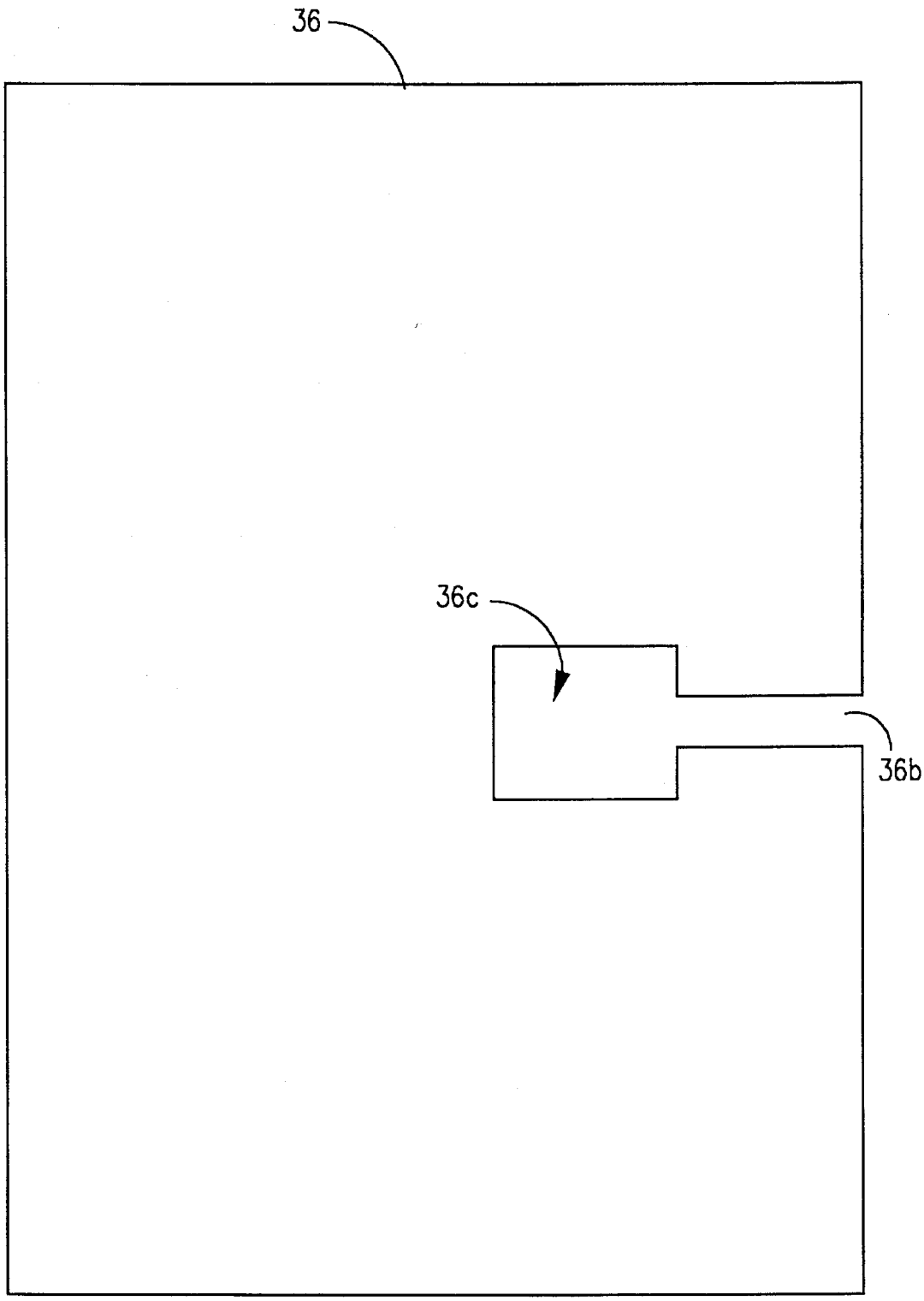
FIG. 6A depicts the die plate.

The view in FIG. 6 is such that a portion of the face of die members 36 are shown. FIG. 6A shows one die member 36a which is a plate of hardened steel about 4" square. A slot 36b in the face of each die member 36 allows the cutting portion of the punching head to pass to successive die members. The portion 36c of the slot allows the back edge of the blade to pass through the die.

Figure 7:
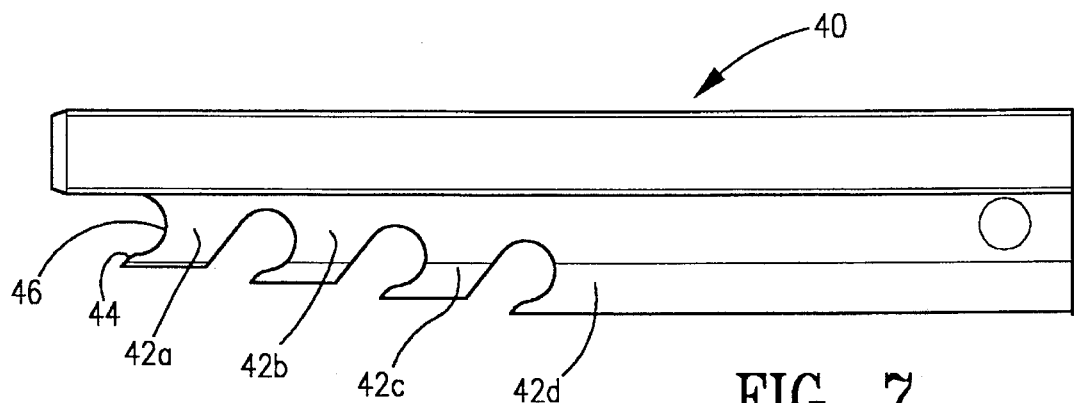
FIG. 7 is an enlarged side view of a punching tool forming part of the apparatus of the invention.
Figure 8:
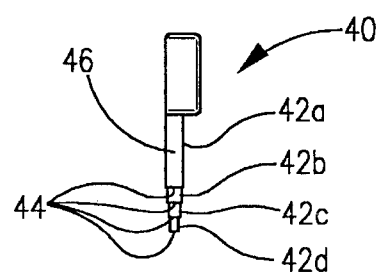
FIG. 8 is an end-on view of the punching tool of FIG. 7.

FIGS. 7 and 8 show different views of a tool 40 (punching head) particularly suited for use in the apparatus 30 to provide a relatively fast speed of operation. The tool 40 is designed to sequentially engage each adjacent rib 14 across the width of an extruded member 10 thereby sequentially removing a longitudinal portion from each rib 14. In a preferred embodiment, the tool has a number of cutting blades 42 (a, b, c, d) which are arranged behind each other along the length of the tool 40. Each cutting blade has a leading cutting edge 44 extending widthwise in a direction normal to the plane of the blade and an arcuate cutting edge 46 extending in the plane of the blade rearwardly away from said leading edge 44.

In use, a blade 42 of the tool 40 is caused to engage a side surface of a rib 14 of the extruded member 10. Movement of the tool 40 transverse to the extruded member 10 causes the leading cutting edge 44 followed by the arcuate cutting edge 46 to cut through the rib 14 punching a portion 18 from the rib 14. The portion 18 punched from the rib has a profile substantially similar to the blade cutting profile. The arcuate cutting edge 46 also cuts to remove the punched out portion 18 of the rib 14 away from the extruded member 10 to prevent such punched out portions 18 from fouling following punching operations.

Each blade 42 (a, b, c, d) of the tool 40 extends outwardly beyond the next blade 42 such that one stroke of the tool 40 across the extruded member 10 results in a number of successive longitudinal portions 18 being removed from each rib 14. The width of the leading cutting edge 44 of each blade 42 (d, c, b, a) increases in a tool stroke forward (cutting) direction (i.e., from right to left starting with blade 42d as viewed in FIG. 7) of the tool such that a preceding blade 42 provides some clearance for a following blade.

The depth of each blade 42 (d, c, b, a) decreases in a tool stroke forward direction, i.e., from right to left.

Figure 12:
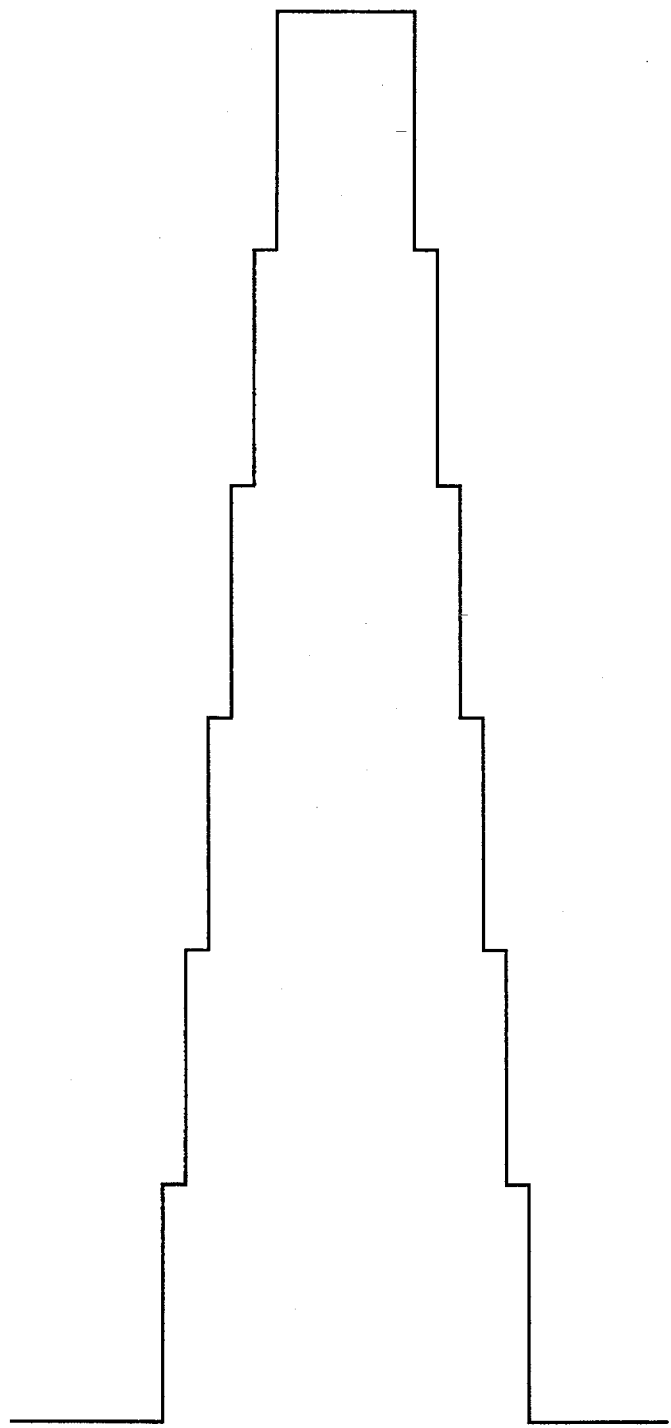
FIG. 12 is similar to FIG. 4 but shows the profiled element with incremental tapering of the ribs.

The use of this preferred punching tool 40 results in the rib portions 22 of the profiled elements 16 formed by the process of the invention having tapered profiles (FIG. 4) being wider at their bases adjacent to the base member 12. The blades 42 of the punching tool 40 are profiled such that the rib portions 22 have a "Christmas tree" profile, incrementally widening towards their bases, as shown in FIG. 12.

The repetition of the punching operation along the length of the extruded member 10 results in the transformation of each rib 14 to a row of rib portions 22 separated by gaps 23 which are, in this case, of equal length to the rib portions 22.

The width of the gaps 23 can be of any length but are preferably equal in length to the rib portions 22.

Movement of the extruded member 10 relative to the punching means 34 is controlled by the conveyance means 32 although, it is envisaged, that the punching means 34 may itself be movable relative to the extruded member 10 which, in such a case, would be held stationary.

While a punching means 34 having only one punch head (punching tool) and associated die means could be controlled to process the extruded member in a step-wise manner as aforesaid, in a preferred embodiment the punching means has a plurality of punch heads and a common die means arranged such that, in use, a plurality of adjacent ribs 14 can be engaged over extended portions of their lengths for simultaneous removal of a number of longitudinally extending portions 18 from each of said ribs 14. In such an arrangement, the drive means which could be a press is arranged to provide a driving force to each of said punch heads. The punch heads may be driven simultaneously or sequentially.

Figure 3:
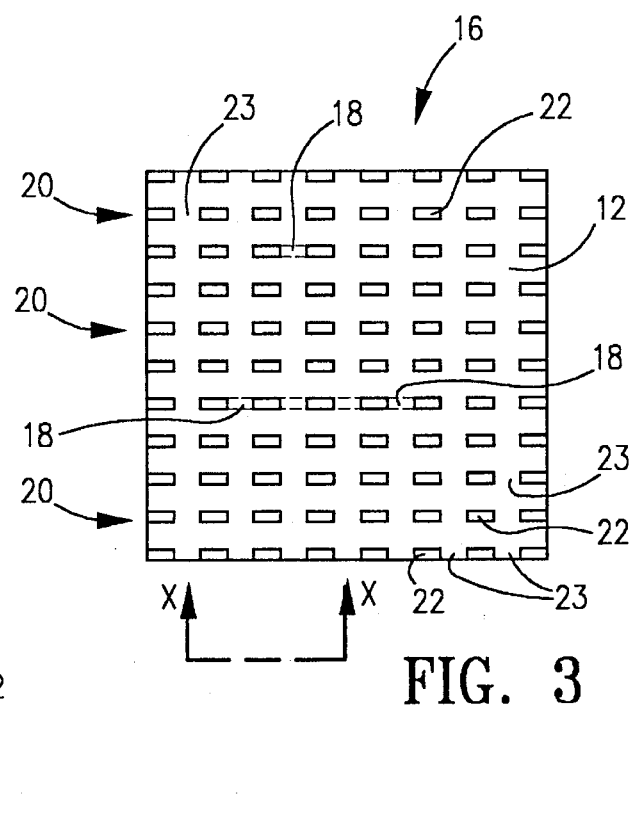
FIG. 3 is a plan view of a profiled element formed by the process of the invention.
Figure 4:
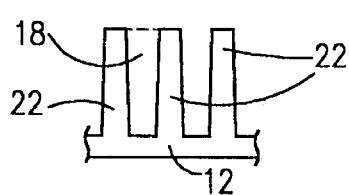
FIG. 4 is an elevated side view of section X—X of FIG. 3.
Figures 9, 10:
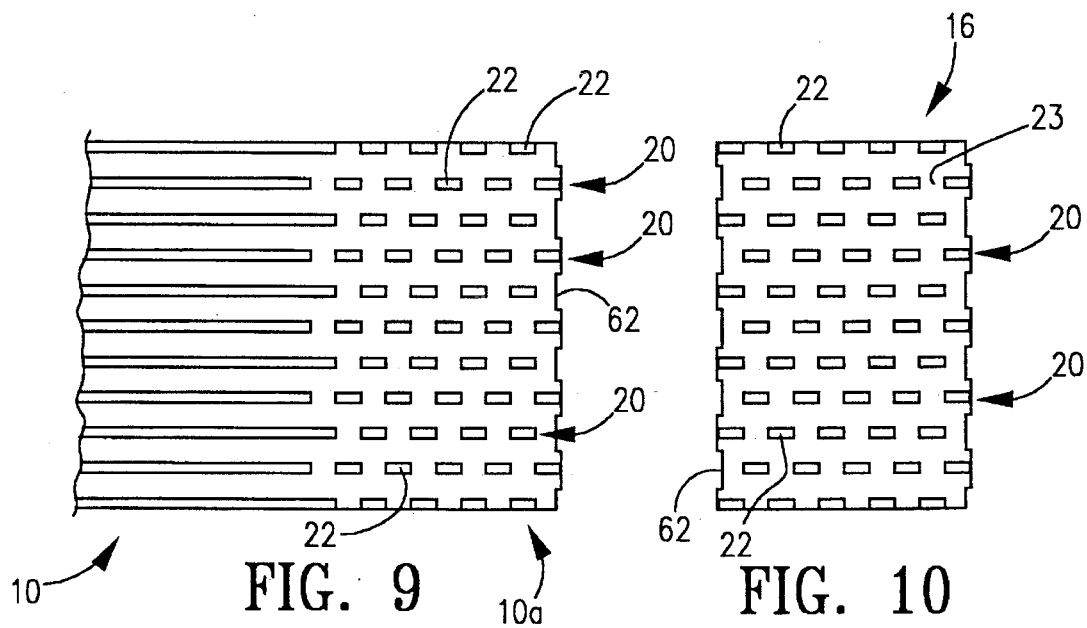
FIG. 9 is a plan view of another extruded member with a leading edge portion thereof having been processed in accordance with alternative aspects of the process of the invention.
FIG. 10 is a plan view of a profiled element formed by the alternative aspects of the process of the invention.
Figure 11:
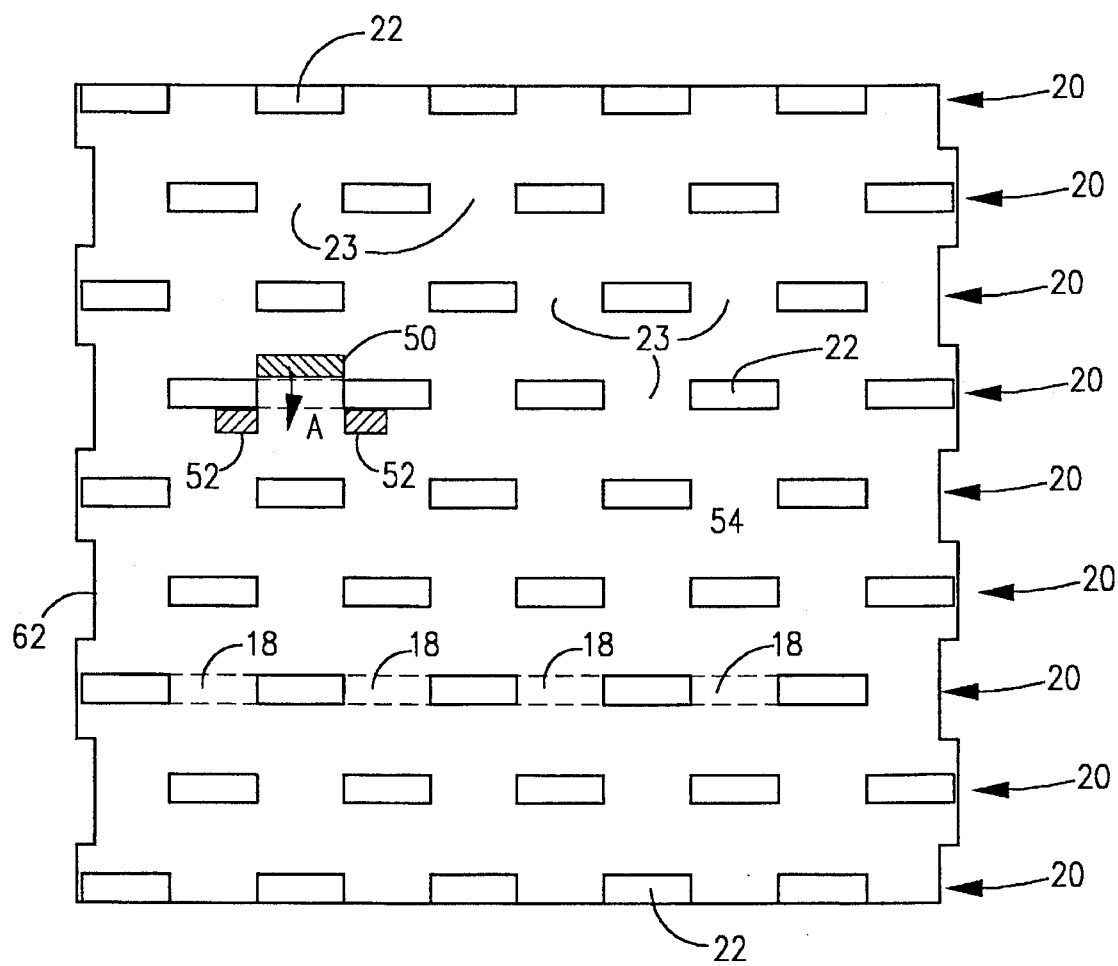
FIG. 11 is an enlarged plan view of the element of FIG. 9.

FIGS. 9 to 11 show an extruded member which has been processed in accordance with the invention to provide a profiled element 16 having a different arrangement of rib portions 22 to that shown in FIGS. 3 and 4. Like numerals are used to denote like parts. In this case, the punching means 34 of the apparatus 30 is such that it is only capable of engaging a single rib 14 to remove a longitudinally extending portion 18 therefrom.

The punching means 34 is processor controlled to adapt to any width of extruded member 10 by controlled transverse movement as well as longitudinal movement relative to the extruded member 10 prior to engaging it for processing as aforesaid.

One advantage of this process is that it provides a profiled element 16 in which the rib portions 22 of adjacent ribs 14 are staggered, i.e., not in transverse alignment. It is not possible to achieve this arrangement of rib portions 22 by cross-cut sawing in which all rib portions lie one behind the other in the transverse direction.

The apparatus used to produce this profiled element is generally the same as that for forming the profiled element 16 of FIGS. 3 and 4.

The punching means 34 comprises at least one punch head 50 and a die 52 (shown in position in FIG. 11) which, in use, are lowered into contact with an upper surface 54 of the extruded member 10 such that the die 52 locates adjacent a side surface of a rib 14 and the punch head 50 locates on an opposing side of said rib (see FIG. 11).

The repetition of the punching operation along the length of each rib 14 results in the transformation of a rib to a row of rib portions 22.

The punching head 34 is movable transversely relative to the extruded member 10 to allow said punching means 34 to process extruded members 10 of various transverse widths.

While a punching means 34 having only one punch head 50 and die 52 could be controlled to process the extruded member 10 in a step-wise manner as aforesaid, in a preferred embodiment the punching means 34 has a plurality of punch heads 50 and their respective dies 52 arranged in a matrix configuration whereby, in use, said punch heads 50 and dies 52 engage a plurality of adjacent ribs 14 over extended portions of their lengths for simultaneous removal of a number of longitudinally extending portions 18 (shown in broken outline in FIG. 11) from each of said ribs 14. In such an arrangement, a drive means such as a press is arranged to provide a driving force to each of said punch heads 50 simultaneously.

It can be seen that the arrangement of the rib portions 22 relative to each other in their respective rows 20 is determined by the arrangement of punch heads 50 of the punching means 34 and this enables any pattern of rib portions 22 to be achieved by the use of an appropriately designed punching means 34.

The apparatus also includes means 60 (FIG. 5) for parting-off predetermined lengths of the already processed portion 10a of the extruded member 10 in order to form profiled elements 16 of such predetermined lengths.

The means 60 for parting-off may be a saw means but this would have the disadvantage of creating sawn edges as discussed aforesaid. In the preferred embodiment, the parting-off means comprises a punching means (not shown) arranged to act normally to the plane of the sheet-form member 12 of the extruded member 10 and which transversely engages said member across gaps 23 between rib portions 22. Consequently, in the case where the rib portions are arranged not to be in transverse alignment (FIGS. 9 to 11), the profile of a cutting edge 62 of the normally acting punching means must be designed accordingly and as can be seen from FIGS. 9 to 11 results in step-wise profiled edges on the profiled elements 16.

It is envisaged that the profiled elements formed by the process of the invention will be utilized as semi-conductor heat-sinks since their arrangement of transversely spaced rows of rib portions provides improved heat dissipating characteristics. As such they should be formed from an extruded metal member or an extruded member of any other suitable thermally conductive material.

While a preferred embodiment has been shown and described, various modifications are within the true spirit and scope of the invention. The appended claims are, therefore, intended to cover all such modifications.

What is claimed is:

1. A heat dissipating element comprising an extruded longitudinally extending base member having a plurality of transversely spaced rows of longitudinally extending and spaced apart rib portions upstanding therefrom, wherein the rib portions taper progressively in a depthwise direction towards the extruded base member, said heat dissipating element having gaps between said spaced apart rib portions which are removed in a transverse punching operation, and wherein said base member and rib portions are formed of metal or other suitable thermally conductive material.

2. A heat dissipating element as claimed in claim 1 wherein the rib portions of adjacent rows are arranged so as not to be generally in transverse alignment.

3. A heat dissipating element as claimed in claim 1 wherein the rib portions taper incrementally in a depthwise direction towards said extruded base member.

* * * * *